(12) United States Patent
Lee et al.

(10) Patent No.: US 8,921,955 B1
(45) Date of Patent: Dec. 30, 2014

(54) SEMICONDUCTOR DEVICE WITH MICRO ELECTROMECHANICAL SYSTEM DIE

(75) Inventors: Jae Ung Lee, Jungnang-gu (KR); Byong Jin Kim, Bucheon Si Sosa-gu (KR); Hyung Il Jeon, Namyangju Si (KR); Eun Jung Jo, Gangnam-gu (KR); Koo Woong Jeong, Gongju Si (KR)

(73) Assignee: Amkor Technology, Inc., Chandler, AZ (US)

( * ) Notice: Subject to any disclaimer, the term of this patent is extended or adjusted under 35 U.S.C. 154(b) by 981 days.

(21) Appl. No.: 13/034,517

(22) Filed: Feb. 24, 2011

(51) Int. Cl.
*H01L 29/84* (2006.01)

(52) U.S. Cl.
USPC ......................................................... 257/416

(58) Field of Classification Search
USPC ......................................................... 257/416
See application file for complete search history.

(56) References Cited

U.S. PATENT DOCUMENTS

| | | | |
|---|---|---|---|
| 6,384,472 B1 | 5/2002 | Huang | |
| 6,476,469 B2 | 11/2002 | Hung et al. | |
| 6,522,761 B1 | 2/2003 | Ruffa | |
| 6,781,231 B2 | 8/2004 | Minervini | |
| 7,132,307 B2 | 11/2006 | Wang et al. | |
| 7,166,910 B2 | 1/2007 | Minervini | |
| 7,242,089 B2 | 7/2007 | Minervini | |
| 7,381,049 B2 | 6/2008 | Li et al. | |
| 7,381,589 B2 | 6/2008 | Minervini | |
| 7,382,048 B2 | 6/2008 | Minervini | |
| 7,434,305 B2 | 10/2008 | Minervini | |
| 7,439,616 B2 | 10/2008 | Minervini | |
| 7,501,703 B2 | 3/2009 | Minervini | |
| 7,537,964 B2 | 5/2009 | Minervini | |
| 7,900,521 B2 * | 3/2011 | Hooper et al. | 73/756 |
| 8,018,049 B2 | 9/2011 | Minervini | |
| 2003/0035558 A1 | 2/2003 | Kawamura et al. | |
| 2004/0184632 A1 | 9/2004 | Minervini | |
| 2006/0157841 A1 | 7/2006 | Minervini | |
| 2007/0082421 A1 | 4/2007 | Minervini | |
| 2007/0201715 A1 | 8/2007 | Minervini | |
| 2007/0202627 A1 | 8/2007 | Minervini | |
| 2007/0215962 A1 | 9/2007 | Minervini | |
| 2008/0219482 A1 * | 9/2008 | Sato | 381/174 |
| 2009/0127638 A1 * | 5/2009 | Kilger et al. | 257/415 |
| 2009/0140413 A1 * | 6/2009 | Wang et al. | 257/698 |
| 2009/0243058 A1 * | 10/2009 | Shirasaka | 257/670 |
| 2011/0254111 A1 * | 10/2011 | Leclair et al. | 257/416 |

* cited by examiner

*Primary Examiner* — Anthony Ho
(74) *Attorney, Agent, or Firm* — Kevin B. Jackson

(57) ABSTRACT

In one embodiment, a miniaturized, multi-function, highly integrated and high performance semiconductor device or package includes a microphone implemented using a MEMS (Micro Electro Mechanical System) die. The semiconductor device includes a leadframe and a body collectively defining a port hole. The port hole facilitates the exposure of a diaphragm of the MEMS die in the semiconductor device.

20 Claims, 9 Drawing Sheets

SEMICONDUCTOR DEVICE WITH MICRO ELECTROMECHANICAL SYSTEM DIE

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Field of the Invention

The present invention relates generally to integrated circuit package technology and, more particularly, to miniaturized, multi-function, highly integrated and high performance semiconductor device or package which includes a microphone implemented using a MEMS (Micro Electro Mechanical System) die.

2. Description of the Related Art

Semiconductor dies are conventionally enclosed in plastic packages that provide protection from hostile environments and enable electrical interconnection between the semiconductor die and an underlying substrate such as a printed circuit board (PCB) or motherboard. The elements of such a package include a metal leadframe, an integrated circuit or semiconductor die, bonding material to attach the semiconductor die to the leadframe, bond wires which electrically connect pads on the semiconductor die to individual leads of the leadframe, and a hard plastic encapsulant material which covers the other components and forms the exterior of the semiconductor package commonly referred to as the package body.

The leadframe is the central supporting structure of such a package, and is typically fabricated by chemically etching or mechanically stamping a metal strip. A portion of the leadframe is internal to the package, i.e., completely surrounded by the plastic encapsulant or package body. Portions of the leads of the leadframe may extend externally from the package body or may be partially exposed therein for use in electrically connecting the package to another component. In certain semiconductor packages, a portion of the die pad of the leadframe also remains exposed within the package body.

Leadframes for semiconductor devices or packages can be largely classified into copper-based leadframes (copper/iron/phosphorous; 99.8/0.01/0.025), copper alloy-based leadframes (copper/chromium/tin/zinc; 99.0/0.25/0.22), and alloy 42-based leadframes (iron/nickel; 58.0/42.0) according to the composition of the elements or materials included in the leadframe. Exemplary semiconductor devices employing leadframes include a through-hole mounting dual type inline package (DIP), a surface mounting type quad flat package (QFP), and a small outline package (SOP). The aforementioned semiconductor devices are often viewed as being advantageous for their smaller size and superior electrical performance.

Currently known multimedia devices such as camcorders, MP3 players, smart phones, and the like are commonly provided with the functionality or recording sounds. In particular, miniaturized and highly integrated multimedia devices, such as those highlighted above, have the capacity to maintain high levels of performance while normally performing a recording function through the use of a small-sized microphone incorporated into the multimedia device.

In recent years, the electronics industry has witnessed an increasingly widespread use of semiconductor fabrication techniques using micromachining for effectively increasing the density of semiconductor devices mounted in microelectronic devices. Specifically, MEMS (Micro Electro Mechanical System) is an applied technique of a semiconductor process (and in particular an integrated circuit technique) which enables fabrication of electromechnical structures such as ultramicro sensors or actuators at a micrometer ($\square$) level. A microphone implemented using an MEMS die fabricated by a micromachining technique can realize miniaturization, high performance, multi-functionality, and high levels of integration, while semiconductor devices often prove to be unsatisfactory. The present invention address the aforementioned need by providing a miniaturized, multi-function, highly integrated and high performance semiconductor device or package which includes a microphone implemented using a MEMS (Micro Electro Mechanical System) die. These, as well as other features and attributes of the present invention will be discussed in more detail below.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1:
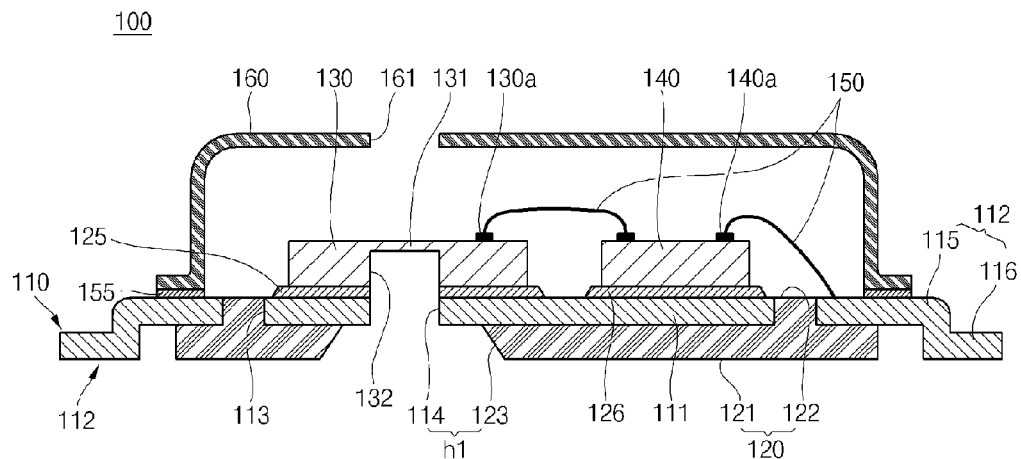
FIG. 1 is a cross-sectional view of a semiconductor device or package constructed in accordance with a first embodiment of the present invention.

Referring now to the drawings wherein the showings are for purposes of illustrating preferred embodiments of the present invention only, and not for purposes of limiting the same, FIG. 1 depict a semiconductor package or device 100 constructed in accordance with a first embodiment of the present invention. The semiconductor device 100 comprises a leadframe 110 which includes a generally quadrangular (e.g., square) die paddle or die pad 111 which defines four peripheral edge segments. Additionally, when viewed from the perspective shown in FIG. 1, the die pad 111 defines opposed, generally planar top and bottom surfaces.

As seen in FIG. 1, the die pad 111 includes an exposure hole or aperture 114 formed therein. The functionality of the aperture 114 in the completed semiconductor device 100 will be described in more detail below.

In addition to the die pad 111, the leadframe 110 comprises a plurality of leads 112. In the semiconductor device 100, the leads 112 are preferably segregated into four sets, with each set of the leads 112 extending along and in spaced relation to a corresponding one of the peripheral edge segments defined by the die pad 111. The number of leads 112 included in each set thereof may be varied in accordance with the prescribed application for the semiconductor device 100. Each of the leads 112 is preferably bent so as to define an inner portion 115 and an outer portion 116 which extend along respective ones of a spaced, generally parallel pair of plains. In this regard, when viewed from the perspective shown in FIG. 1, the opposed top and bottom surfaces of the inner portion 115 of each lead 112 extend in generally co-planar relation to respective ones of the opposed top and bottom surfaces of the die pad 111. As further seen in FIG. 1, the leads 112 are separated from the die pad 111 and each other by spaces or gaps 113.

The leadframe 110 may be fabricated from a conventional metal material, such as copper, copper alloy, steel plated with copper, or a functional equivalent. By way of example, the leadframe 110 may be a copper-based leadframe (copper/iron/phosphorous; 99.8/0.01/0.025), a copper alloy-based leadframe (copper/chromium/tin/zinc; 99.0/0.25/0.22), or an alloy 42-based leadframe (iron/nickel; 58.0/42.0). However, those of ordinary skill in the art will recognize that the present invention is not limited to any particular material for the leadframe 110. Additionally, though the leads 112 are described above as being segregated into four sets, it will be recognized that fewer sets thereof may be provided, and may be arranged along any combination of two or three of the peripheral sides of the die pad 111. It is further contemplated that the leadframe 110 may be fabricated through the implementation of a chemical etching process or alternatively a mechanical stamping process.

The semiconductor device 100 further comprises a MEMS die 130, the bottom surface of which is attached to the top surface of the die pad 111 through the use of an adhesive layer 125. The MEMS die 130 includes a hole or opening 132 formed therein, one end of which is covered by a diaphragm 131 of very small thickness. That end of the opening 132 covered by the diaphragm 130 is that end which is disposed furthest from the die pad 111, and in particular the top surface thereof. As seen in FIG. 1, the MEMS die 130 is attached to the die pad 111 at a location wherein the opening 132 thereof, and hence the diaphragm 131, is substantially aligned with the aperture 114 disposed within the die pad 111. The MEMS die 130 also includes one or more terminals or bond pads 130a formed on the top surface thereof.

The semiconductor device 100 further comprises a semiconductor die 140 which, like the MEMS die 130, has a bottom surface which is attached to the top surface of the die pad 111 by an adhesive layer 126. When attached to the top surface of the die pad 111 by respective ones of the adhesive layers 125, 126, the MEMS die 130 and the semiconductor die 140 are disposed in spaced relation to each other. As seen in FIG. 1, the top surface of the semiconductor die 140 includes one or more bond pads 140a disposed thereon.

In the semiconductor device 100, the MEMS die 130 is electrically connected to the semiconductor die 140 through the use of at least one conductive wire 150 which extends from one of the bond pads 130a of the MEMS die 130 to a corresponding one of the bond pads 140a of the semiconductor die 140. Additionally, one or more bond pads 130a of the MEMS die 130 and/or one or more of the bond pads 140a of the semiconductor die 140 are each preferably electrically connected to a corresponding one of the leads 112 through the use of a conductive wire 150. In FIG. 1, one exemplary conductive wire 150 is depicted as electrically connecting the MEMS die 130 and the semiconductor die 140 to each other, with one exemplary conductive wire 150 being shown as electrically connecting one of the bond pads 140a of the semiconductor die 140 to a respective one of the leads 112. In the semiconductor device 100, it is contemplated that any conductive wire(s) 150 extending between any bond pads 130a, 140a and any lead 112 will extend to the top surface of the inner portion 115 of such lead 112.

In the semiconductor device 100, the die pad 111 and the leads 112 are at least partially encapsulated or covered by an encapsulant material which, upon hardening, forms a body 120 of the semiconductor device 100. As seen in FIG. 1, the body 120 is formed so as to flow through at least portions of the gaps 113 separating the leads 112 from each other, and from the die pad 111. As such, the fully formed body 120 partially encapsulates the inner portions 115 of the leads 112, and defines a generally planar top surface 122 which extends in generally co-planar relation to the top surface of the die pad and the top surfaces of the inner portions 115 of the leads 112. The fully formed body 120 further defines a generally planar bottom surface 121 which extends in generally co-planar relation to the bottom surface defined by the outer portion 116 of each of the leads 112. The body 120 also functions to prevent undesirable short circuits between the leadframe 110 and an external device to which the outer portions 116 of the leads 112 may be mounted. Additionally, the partial encapsulation of the die pad 111 and leads 112 by virtue of the flow of the encapsulant material used to form the body 120 through at least portions of the gaps 113 improves the coupling force or mechanical interlock between the body 120 and the leadframe 110.

As further seen in FIG. 1, the body 120 of the semiconductor device 100 is further formed to include an exposure hole or aperture 123 formed therein. The aperture 123 is preferably defined by a circularly configured, beveled surface which extends angularly between the bottom surface 121 of the body 120 and the bottom surface of the die pad 111. Additionally, the aperture 123 is formed within the body 120 so as to be coaxially aligned with the aperture 114 formed within the die pad 111. As such, the apertures 114, 123 and the bottom surface of the die pad 111 collectively define a port hole h1 which is coaxially aligned with the opening 132 of the MEMS die 130, and hence the diaphragm 131 thereof.

The semiconductor device 100 further comprises a cover or lid 160 which is attached to the leadframe 110 and to the body 120. More particularly, the lid 160 is attached to the exposed portions of the top surfaces of the inner portions 115 of the leads 112, and to a peripheral portion of the top surface 122 of the body 120, including those portions of the top surface 122 which are disposed between adjacent pairs of the leads 112. The attachment of the lid 160 to the leads 112 and body 120 is preferably facilitated through the use of an adhesion member 155. In the semiconductor device 100, it is contemplated that the adhesion member 155 may be made of an insulating material or a conductive material. By way of example and not by way of limitation, the adhesion member 155 may be made of a conductive material such as solder, with an electrical path thus being formed between the lid 160, the adhesion member 155 and the leadframe 110. In this instance, any lead 112 of the leadframe 110 contacting the adhesion member 155 may be used as a ground region. When the lid 160 is attached to the leadframe 110 and the body 120 in the aforementioned manners, such lid 160 effectively covers the MEMS die 130, the semiconductor die 140, and the conductive wires 150. The lid 160 is further formed to include an acoustic hole 161 which, as seen in FIG. 1, is substantially aligned with the diaphragm 131 of the MEMS die 130. The use of the acoustic hole 161 will be discussed in more detail below. The lid 160 may be made of a metal material, though other materials for the lid 160 are contemplated to be within the spirit and scope of the present invention.

The port hole h1 collectively defined by the apertures 114, 123 effectively exposes the diaphragm 131 of the MEMS die 130 in the semiconductor device 100. In this regard, the port hole h1 allows the diaphragm 131 to sufficiently react with an externally applied acoustic signal. The gradually increasing width or diameter of the port hole h1 from the bottom surface of the die pad 111 to the bottom surface 121 of the body 120 attributable to the beveled configuration of the wall of the body 120 defining the aperture 123 improves the transmission of the externally applied acoustic signal to the diaphragm 131.

As indicated above, the acoustic hole 161 of the lid 160 allows for the passage of an acoustic signal therethrough. In the semiconductor device 100, the MEMS die 130 is configured to convert the acoustic signal supplied through the acoustic hole 161 of the lid 160 into an electrical signal according to a change in the capacitance. Stated another way, the MEMS die 130 is configured to detect capacitance varying according to oscillation of the diaphragm 131 (the oscillation generated by the acoustic wave induced through the acoustic hole 161 of the lid 160), and to then convert the detected capacitance into an electrical signal. The MEMS die 130 may be fabricated such that a back plate is formed on a wafer using a MEMS technique, with the diaphragm 131 thereafter being formed on the MEMS die 130.

The semiconductor die 140 included in the semiconductor device 100 and electrically connected to the MEMS die 130 may be formed as an application specific integrated circuit (ASIC) for processing an electrical signal. For example, the semiconductor die 140 may include a voltage pump that offers a voltage to allow the MEMS die 130 to operate as a condenser microphone, and a buffer IC for providing an acoustic signal detected by the MEMS die 130 to an external device through a connection terminal by amplifying or matching the detected acoustic signal.

Thus, based on the foregoing, the semiconductor device 100 may implement a microphone using the leadframe 110 rather than a conventional printed circuit board or PCB, thus allowing for such implementation at lower cost. Additionally, the configuration of the leadframe 110 and body 120, considered in conjunction with the manner in which the MEMS die 130 is secured to the leadframe 110 and aligned with the port hole h1, allows the diaphragm 131 of the MEMS die 130 to sufficiently react with an externally applied acoustic signal, thereby providing a highly reliable microphone.

Figure 4:
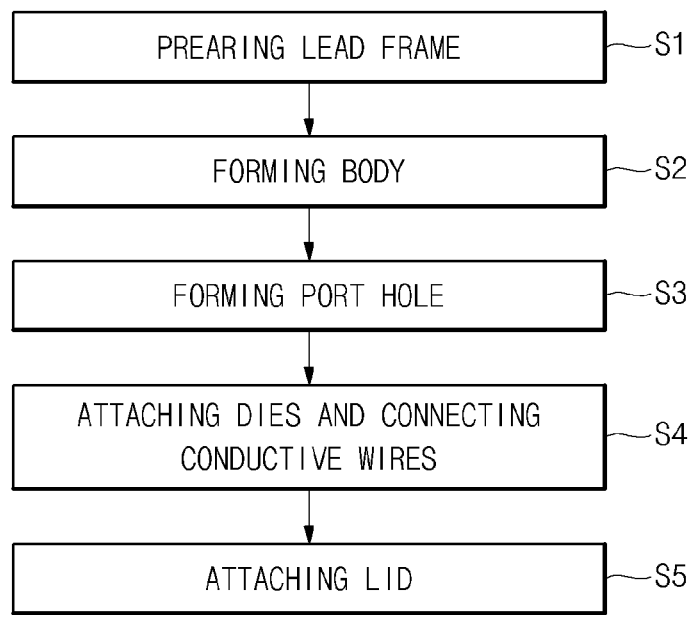
FIG. 4 is a flow chart describing an exemplary fabrication method for the semiconductor device of the first embodiment shown in FIG. 1.

Referring now to FIG. 4, there is provided a flow chart which sets forth an exemplary method for fabricating the semiconductor device 100 of the present invention. The method comprises the steps of preparing the leadframe 110 (S1), forming the body 120 (S2), forming the port hole h1 (S3), attaching the MEMS and semiconductor dies 130, 140 to the leadframe 110 and electrically connecting them to the leadframe 110 and each other through the use of the conductive wires (S4), and attaching the lid 160 to the leadframe 110 and body 120 (S5). FIGS. 5A-5E provide illustrations corresponding to these particular steps, as will be discussed in more detail below.

Figure 5A:
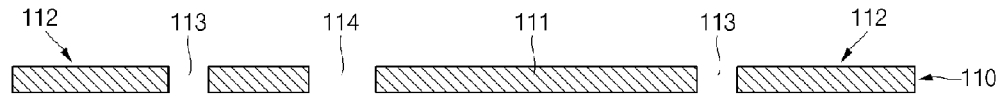
FIGS. 5A-5E are views illustrating an exemplary sequence of steps for the fabrication of the semiconductor device of the first embodiment shown in FIG. 1.

Referring now to FIG. 5A, in the initial step S1 of the fabrication process for the semiconductor device 100, the leadframe 110 having the above-described structural attributes is provided. The leadframe 110 includes the die pad 111 having the aperture 114 formed therein, and the leads 112. However, as seen in FIG. 5A, the leads 112, in their originally formed state, are not bent, and thus do not yet define the separate inner and outer portions 115, 116. As indicated above, the leadframe 110 may be formed through the use of either an etching or a mechanical stamping technique.

Figure 5B:
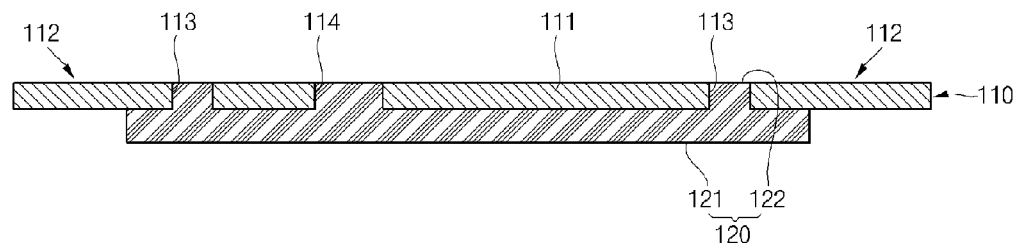

Referring now to FIG. 5B, in the next step S2 of the fabrication process for the semiconductor device 100, the body 120 is formed in the aforementioned manner. In this regard, as previously explained, the encapsulant material used to form the body 120 is applied to the die pad 111 and leads 112 of the leadframe 110 so as to flow through the gaps 113 separating the leads 112 from each other, and from the die pad 111. As further seen in FIG. 5B, the encapsulant material used to form the body 120 also flows through the aperture 114 within the die pad 111. As is apparent from FIG. 5B, the encapsulant material which hardens into the body 120 is not applied to those portions of the leads 112 which will eventually define the outer portions 116 thereof. The body 120 may be formed by, for example, molding using a resin.

Figure 5C:
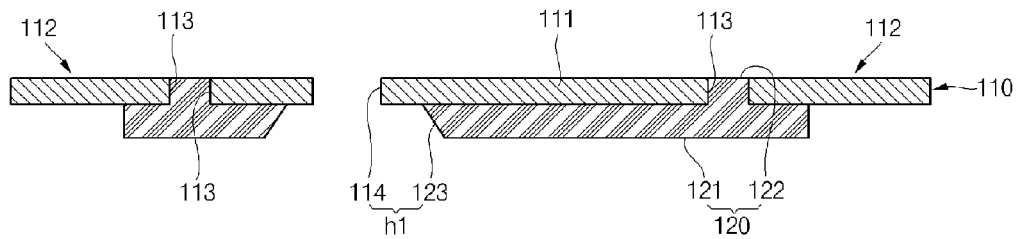

Referring now to FIG. 5C, in the next step S3 of the fabrication process for the semiconductor device 100, the port hole h1 is formed in the body 120 and die pad 111. The formation of the port hole h1 is accomplished by subjecting the body 120 to an ablation process which facilitates the formation of the above-described aperture 123 and the removal of the encapsulant material used to form the body 120 from within the aperture 114. The ablation of the body 120 may be accomplished by, for example, the use of a laser ablation process.

Figure 5D:
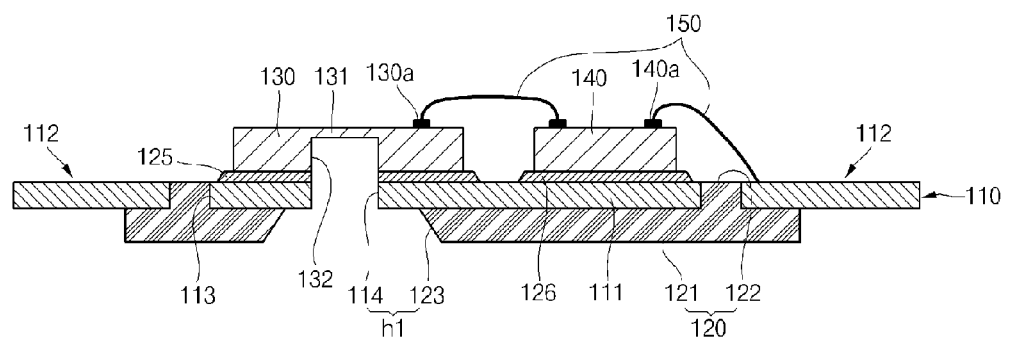

Referring now to FIG. 5D, in the next step S4 of the fabrication process for the semiconductor device 100, the MEMS die 130 and semiconductor die 140 are each attached to the top surface of the die pad 111 through the use of the adhesive layers 125, 126 in the above-described orientations. Thus, as previously explained, the opening 132 of the MEMS die 130, and hence the diaphragm 131 thereof, are each coaxially aligned with the port hole h1. Thereafter, as also seen in FIG. 5D, the conductive wires 150 are used to electrically connect the MEMS and semiconductor dies 130, 140 to each other and to one or more leads 112 of the leadframe 110 in any one of a multiplicity of potential arrangements.

Figure 5E:
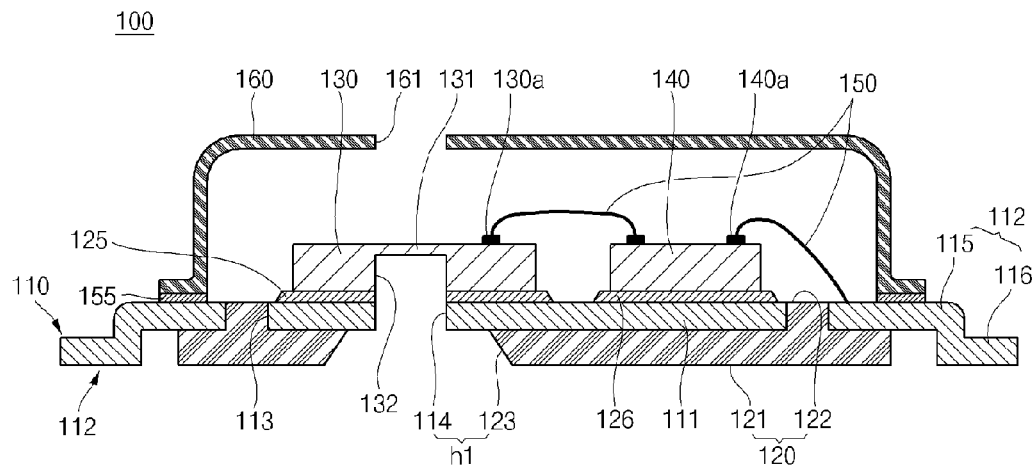

Referring now to FIG. 5E, in the next step S5 of the fabrication process for the semiconductor device 100, the lid 160 is attached to the leads 112 and to the body 120 through the use of the above-described adhesion member 155. When attached to the leads 112 of the leadframe 110 and to the body 120, the lid 160 effectively covers the MEMS and semiconductor dies 130, 140, as well as the conductive wires 150, with the acoustic hole 161 of the lid 160 being substantially aligned with the diaphragm 131 of the MEMS die 130. Subsequent to the attachment of the lid 160 to the leadframe 110 and body 120, the leads 112 are preferably subjected to a bending process as results in the same each defining the above-described inner and outer portions 115, 116.

Thus, in the semiconductor device 100 fabricated in accordance with the above-described manufacturing method, the port hole h1 can be formed in a simplified manner using laser ablation. Thus, the manufacturing method for the semiconductor device 100 can simplify the process of facilitating the exposure of the diaphragm 131 of the MEMS die 130.

Figure 2:
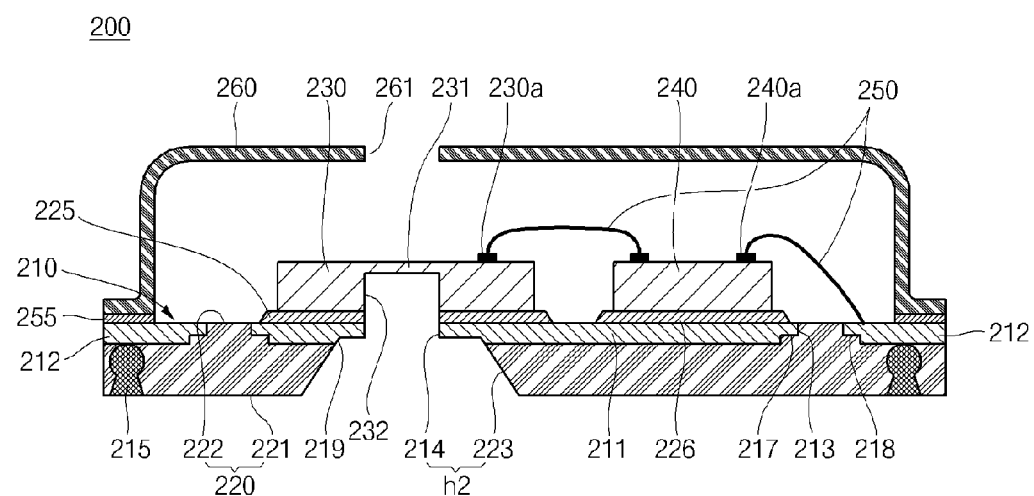
FIG. 2 is a cross-sectional view of a semiconductor device or package constructed in accordance with a second embodiment of the present invention.

Referring now to FIG. 2, there is shown a semiconductor package or device 200 constructed in accordance with a second embodiment of the present invention. The semiconductor device 200 comprises a leadframe 210 which includes a generally quadrangular (e.g., square) die paddle or die pad 211 which defines four peripheral edge segments. Additionally, when viewed from the perspective shown in FIG. 2, the die pad 211 defines opposed, generally planar top and bottom surfaces. As seen in FIG. 2, the die pad 211 includes an exposure hole or aperture 214 formed therein. The functionality of the aperture 214 in the completed semiconductor device 200 will be described in more detail below. As further seen in FIG. 2, the die pad 211 of the leadframe 210 is not of uniform thickness. Rather, a peripheral portion of the bottom surface of the die pad 211 is partially etched (e.g., half-etched) to define an etched surface 217. Further, a portion of the bottom surface of the die pad 211 circumventing the aperture 214 is partially etched or otherwise removed or ablated in a manner facilitating the formation of an angled or beveled wall 219.

In addition to the die pad 211, the leadframe 210 comprises a plurality of leads 212. In the semiconductor device 200, the leads 212 are preferably segregated into four sets, with each set of the leads 212 extending along and in spaced relation to a corresponding one of the peripheral edge segments defined by the die pad 211. The number of leads 212 included in each set thereof may be varied in accordance with the prescribed application for the semiconductor device 200. When viewed from the perspective shown in FIG. 2, the opposed, generally planar top and bottom surfaces of each lead 212 extend in generally co-planar relation to respective ones of the opposed top and bottom surfaces of the die pad 211. As seen in FIG. 2, the leads 212 are separated from the die pad 211 and each other by spaces or gaps 213. As further seen in FIG. 2, the leads 212 are not of uniform thickness. Rather, an inner end portion of the bottom surface of each lead 212 is partially etched (e.g., half-etched) to define an etched surface 218. The etched surface of each lead 212 extends to the inner end thereof disposed closest to the die pad 211.

The leadframe 210 may be fabricated from a conventional metal material, such as copper, copper alloy, steel plated with copper, or a functional equivalent. By way of example, the leadframe 210 may be a copper-based leadframe (copper/iron/phosphorous; 99.8/0.01/0.025), a copper alloy-based leadframe (copper/chromium/tin/zinc; 99.0/0.25/0.22), or an alloy 42-based leadframe (iron/nickel; 58.0/42.0). However, those of ordinary skill in the art will recognize that the present invention is not limited to any particular material for the leadframe 210. Additionally, though the leads 212 are described above as being segregated into four sets, it will be recognized that fewer sets thereof may be provided, and may be arranged along any combination of two or three of the peripheral sides of the die pad 211. It is further contemplated that the leadframe 210 may be fabricated through the implementation of a chemical etching process or alternatively a mechanical stamping process.

In the semiconductor device 200, formed on the bottom surface of each of the leads 212 is a conductive member 215. The conductive members 215 are used to facilitate the electrical and mechanical contact between the semiconductor device 200 and an external device. The conductive members 215 each preferably comprise a solder ball which may have the combined structural features of both a spherical and a trapezoidal shape for reasons which will be discussed in more detail below.

The semiconductor device 200 further comprises a MEMS die 230, the bottom surface of which is attached to the top surface of the die pad 211 through the use of an adhesive layer 225. The MEMS die 230 includes a hole or opening 232 formed therein, one end of which is covered by a diaphragm 231 of very small thickness. That end of the opening 232 covered by the diaphragm 230 is that end which is disposed furthest from the die pad 211, and in particular the top surface thereof. As seen in FIG. 2, the MEMS die 230 is attached to the die pad 211 at a location wherein the opening 232 thereof, and hence the diaphragm 231, is substantially aligned with the aperture 214 disposed within the die pad 211. The MEMS die 230 also includes one or more terminals or bond pads 230a formed on the top surface thereof.

The semiconductor device 200 further comprises a semiconductor die 240 which, like the MEMS die 230, has a bottom surface which is attached to the top surface of the die pad 211 by an adhesive layer 226. When attached to the top surface of the die pad 211 by respective ones of the adhesive layers 225, 226, the MEMS die 230 and the semiconductor die 240 are disposed in spaced relation to each other. As seen in FIG. 2, the top surface of the semiconductor die 240 includes one or more bond pads 240a disposed thereon.

In the semiconductor device 200, the MEMS die 230 is electrically connected to the semiconductor die 240 through the use of at least one conductive wire 250 which extends from one of the bond pads 230a of the MEMS die 230 to a corresponding one of the bond pads 240a of the semiconductor die 240. Additionally, one or more bond pads 230a of the MEMS die 230 and/or one or more of the bond pads 240a of the semiconductor die 240 are each preferably electrically connected to a corresponding one of the leads 212 through the use of a conductive wire 250. In FIG. 2, one exemplary conductive wire 250 is depicted as electrically connecting the MEMS die 230 and the semiconductor die 240 to each other, with one exemplary conductive wire 250 being shown as electrically connecting one of the bond pads 240a of the semiconductor die 240 to a respective one of the leads 212. In the semiconductor device 200, it is contemplated that any conductive wire(s) 250 extending between any bond pads 230a, 240a and any lead 212 will extend to the top surface of such lead 212.

In the semiconductor device 200, the die pad 211 and the leads 212 are at least partially encapsulated or covered by an encapsulant material which, upon hardening, forms a body 220 of the semiconductor device 200. As seen in FIG. 2, the body 220 is formed so as to flow through at least portions of the gaps 213 separating the leads 212 from each other and from the die pad 211. As such, the fully formed body 220 partially encapsulates the leads 212 and the die pad 211, and defines a generally planar top surface 222 which extends in generally co-planar relation to the top surface of the die pad 211 and the top surfaces of the leads 212. The fully formed body 220 further defines a generally planar bottom surface 221. In addition to partially encapsulating the die pad 211 and leads 212, the body 220 also partially encapsulates conductive members 215. In this regard, when viewed from the perspective shown in FIG. 2, the generally planar bottom surfaces of the conductive members 215 extend in generally co-planar relation to the bottom surface 221 of the body 220. The body 220 functions to prevent undesirable short circuits between the leadframe 210 and an external device to which the conductive members 215 may be mounted. Additionally, the partial encapsulation of the die pad 211 and leads 212 by virtue of the flow of the encapsulant material used to form the body 220 through at least portions of the gaps 213 improves the coupling force or mechanical interlock between the body 220 and the leadframe 210. Along these lines, the shapes of the conductive members 215 as shown in FIG. 2 increases the coupling force or mechanical interlock between such conductive members 215 and the body 220 when the conductive members 215 are partially encapsulated by the body 220 in the aforementioned manner.

As further seen in FIG. 2, the body 220 of the semiconductor device 200 is further formed to include an exposure hole or aperture 223 formed therein. The aperture 223 is preferably defined by a circularly configured, beveled surface which extends angularly from the bottom surface 221 of the body 220, and is substantially flush or continuous with the beveled wall 219 defined by the die pad 211. Additionally, the aperture 223 is formed within the body 220 so as to be coaxially aligned with the aperture 214 formed within the die pad 211. As such, the apertures 214, 223, and the etched or removed surface of the die pad 211 (including the wall 219) circumventing the aperture 214 collectively define a port hole h2 which is coaxially aligned with the opening 232 of the MEMS die 230, and hence the diaphragm 231 thereof.

The semiconductor device 200 further comprises a cover or lid 260 which is attached to the leadframe 210 and to the body 220. More particularly, the lid 260 is attached to the exposed portions of the top surfaces of the leads 212, and to a peripheral portion of the top surface 222 of the body 220, including those portions of the top surface 222 which are disposed between adjacent pairs of the leads 212. The attachment of the lid 260 to the leads 212 and body 220 is preferably facilitated through the use of an adhesion member 255. In the semiconductor device 200, it is contemplated that the adhesion member 255 may be made of an insulating material or a conductive material. By way of example and not by way of limitation, the adhesion member 255 may be made of a conductive material such as solder, with an electrical path thus being formed between the lid 260, the adhesion member 255 and the leadframe 210. In this instance, any lead 212 of the leadframe 210 contacting the adhesion member 255 may be used as a ground region. When the lid 260 is attached to the leadframe 210 and the body 220 in the aforementioned manners, such lid 260 effectively covers the MEMS die 230, the semiconductor die 240, and the conductive wires 250. The lid 260 is further formed to include an acoustic hole 261 which, as seen in FIG. 2, is substantially aligned with the diaphragm 231 of the MEMS die 230. The use of the acoustic hole 261 will be discussed in more detail below. The lid 260 may be made of a metal material, though other materials for the lid 260 are contemplated to be within the spirit and scope of the present invention.

The port hole h2 collectively defined by the apertures 214, 223 effectively exposes the diaphragm 231 of the MEMS die 230 in the semiconductor device 200. In this regard, the port hole h2 allows the diaphragm 231 to sufficiently react with an externally applied acoustic signal. The gradually increasing width or diameter of the port hole h2 from the etched or removed surface of the die pad 211 circumventing the aperture 214 to the bottom surface 221 of the body 220 attributable to the beveled configurations of the wall 219 and the wall of the body 220 defining the aperture 223 improves the transmission of the externally applied acoustic signal to the diaphragm 231.

As indicated above, the acoustic hole 261 of the lid 260 allows for the passage of an acoustic signal therethrough. In the semiconductor device 200, the MEMS die 230 is configured to convert the acoustic signal supplied through the acoustic hole 261 of the lid 260 into an electrical signal according to a change in the capacitance. Stated another way, the MEMS die 230 is configured to detect capacitance varying according to oscillation of the diaphragm 231 (the oscillation generated by the acoustic wave induced through the acoustic hole 261 of the lid 260), and to then convert the detected capacitance into an electrical signal. The MEMS die 230 may be fabricated such that a back plate is formed on a wafer using a MEMS technique, with the diaphragm 231 thereafter being formed on the MEMS die 230.

The semiconductor die 240 included in the semiconductor device 200 and electrically connected to the MEMS die 230 may be formed as an application specific integrated circuit (ASIC) for processing an electrical signal. For example, the semiconductor die 240 may include a voltage pump that offers a voltage to allow the MEMS die 230 to operate as a condenser microphone, and a buffer IC for providing an acoustic signal detected by the MEMS die 230 to an external device through a connection terminal by amplifying or matching the detected acoustic signal.

Thus, based on the foregoing, the semiconductor device 200 may implement a microphone using the leadframe 210 rather than a conventional printed circuit board or PCB, thus allowing for such implementation at lower cost. Additionally, the configuration of the leadframe 210 and body 220, considered in conjunction with the manner in which the MEMS die 230 is secured to the leadframe 210 and aligned with the port hole h2, allows the diaphragm 231 of the MEMS die 230 to sufficiently react with an externally applied acoustic signal, thereby providing a highly reliable microphone.

Figure 6:
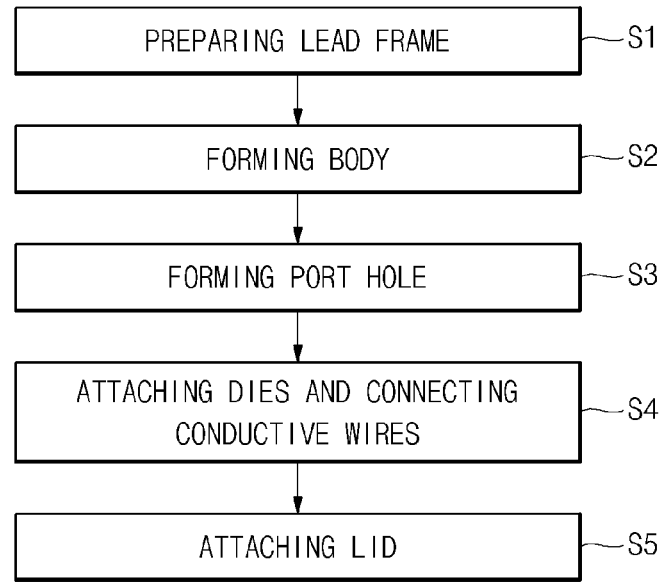
FIG. 6 is a flow chart describing an exemplary fabrication method for the semiconductor device of the second embodiment shown in FIG. 2.

Referring now to FIG. 6, there is provided a flow chart which sets forth an exemplary method for fabricating the semiconductor device 200 of the present invention. The method comprises the steps of preparing the leadframe 210 (S1), forming the body 220 (S2), forming the port hole h2 (S3), attaching the MEMS and semiconductor dies 230, 240 to the leadframe 210 and electrically connecting them to the leadframe 210 and each other through the use of the conductive wires 250 (S4), and attaching the lid 260 to the leadframe 210 and body 220 (S5). FIGS. 5A-5E provide illustrations corresponding to these particular steps, as will be discussed in more detail below.

Figure 7A:
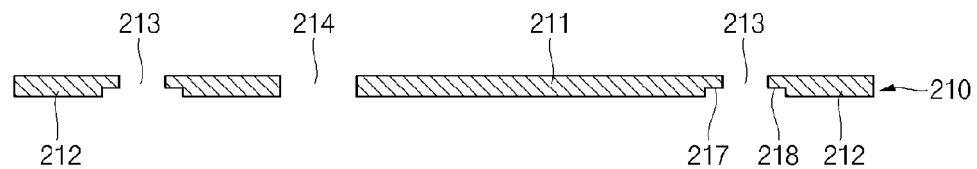
FIGS. 7A-7E are views illustrating an exemplary sequence of steps for the fabrication of the semiconductor device of the second embodiment shown in FIG. 2.

Referring now to FIG. 7A, in the initial step S1 of the fabrication process for the semiconductor device 200, the leadframe 210 having the above-described structural attributes is provided. The leadframe 210 includes the die pad 211 having the aperture 214 formed therein, and the leads 212. As indicated above, the leadframe 210 may be formed through the use of either an etching or a mechanical stamping technique. At the stage of the formation of the leadframe 210 as shown in FIG. 7A, the die pad 211 is provided with the etched surface 217, with each of the leads 212 being provided with the etched surface 218. Upon the formation of the etched surfaces 217, 218, the conductive members 215 are formed on the bottom surfaces of each of the leads 212.

Figure 7B:
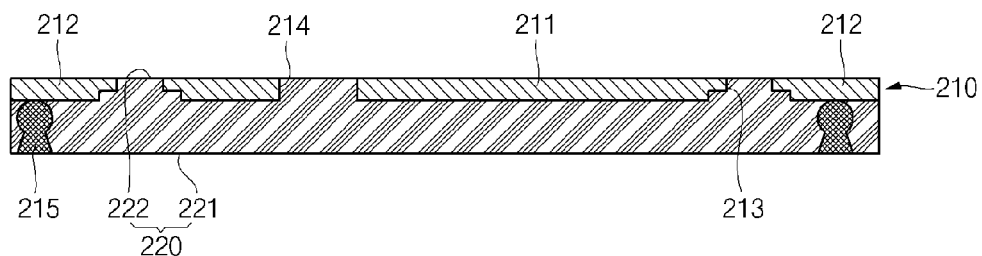

Referring now to FIG. 7B, in the next step S2 of the fabrication process for the semiconductor device 200, the body 220 is formed in the aforementioned manner. In this regard, as previously explained, the encapsulant material used to form the body 220 is applied to the die pad 211 and leads 212 of the leadframe 210 so as to flow through the gaps 213 separating the leads 212 from each other, and from the die pad 211. As further seen in FIG. 7B, the encapsulant material used to form the body 220 also flows through the aperture 214 within the die pad 211. As is also apparent from FIG. 7B, the encapsulant material is also applied to the conductive members 215 so as to partially encapsulate the same in the aforementioned manner. The body 220 may be formed by, for example, molding using a resin.

Figure 7C:
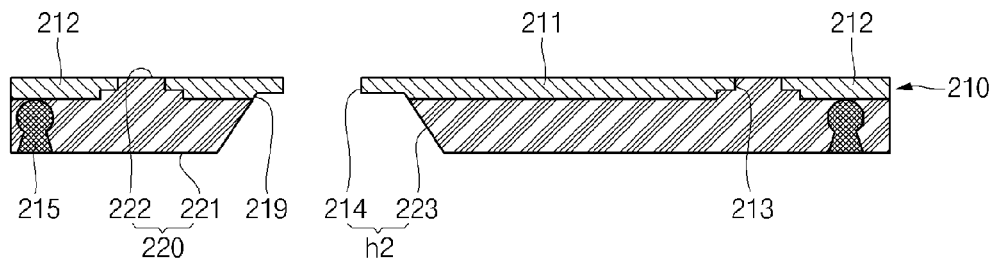

Referring now to FIG. 7C, in the next step S3 of the fabrication process for the semiconductor device 200, the port hole h2 is formed in the body 220 and die pad 211. The formation of the port hole h2 is accomplished by subjecting the body 220 to an ablation process which facilitates the formation of the above-described aperture 223 and the removal of the encapsulant material used to form the body 220 from within the aperture 214. The ablation process also results in the formation of the etched or removed surface of the die pad 211 which circumvents the aperture 214 and defines the beveled wall 219. The ablation process may be accomplished by, for example, the use of a laser.

Figure 7D:
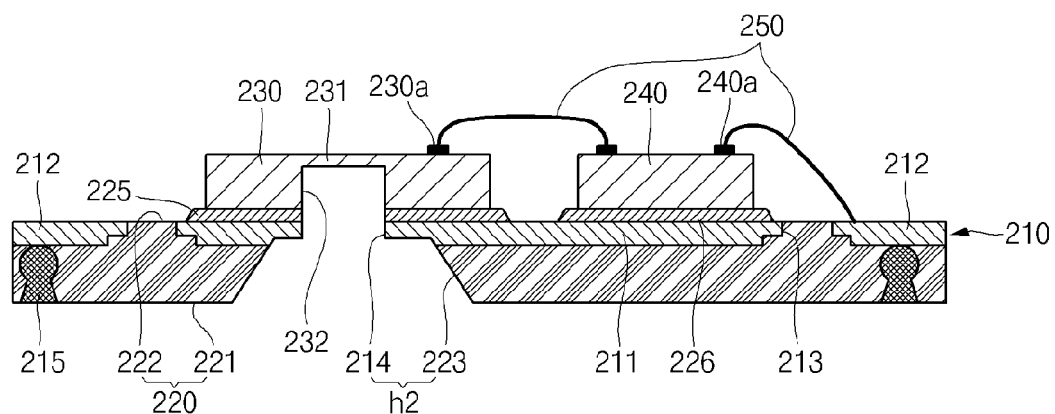

Referring now to FIG. 7D, in the next step S4 of the fabrication process for the semiconductor device 200, the MEMS die 230 and semiconductor die 240 are each attached to the top surface of the die pad 211 through the use of the adhesive layers 225, 226 in the above-described orientations. Thus, as previously explained, the opening 232 of the MEMS die 230, and hence the diaphragm 231 thereof, are each coaxially aligned with the port hole h2. Thereafter, as also seen in FIG. 7D, the conductive wires 250 are used to electrically connect the MEMS and semiconductor dies 230, 240 to each other and to one or more leads 212 of the leadframe 210 in any one of a multiplicity of potential arrangements.

Figure 7E:
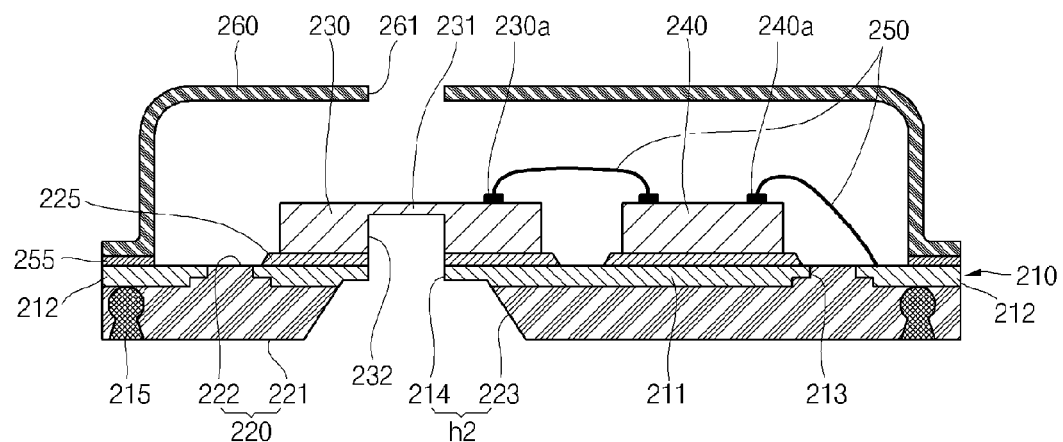

Referring now to FIG. 7E, in the next step S5 of the fabrication process for the semiconductor device 200, the lid 260 is attached to the leads 212 and to the body 220 through the use of the above-described adhesion member 255. When attached to the leads 212 of the leadframe 210 and to the body 220, the lid 260 effectively covers the MEMS and semiconductor dies 230, 240, as well as the conductive wires 250, with the acoustic hole 261 of the lid 260 being substantially aligned with the diaphragm 231 of the MEMS die 230.

Thus, in the semiconductor device 200 fabricated in accordance with the above-described manufacturing method, the port hole h2 can be formed in a simplified manner using laser ablation. Thus, the manufacturing method for the semiconductor device 200 can simplify the process of facilitating the exposure of the diaphragm 231 of the MEMS die 230.

Figure 3:
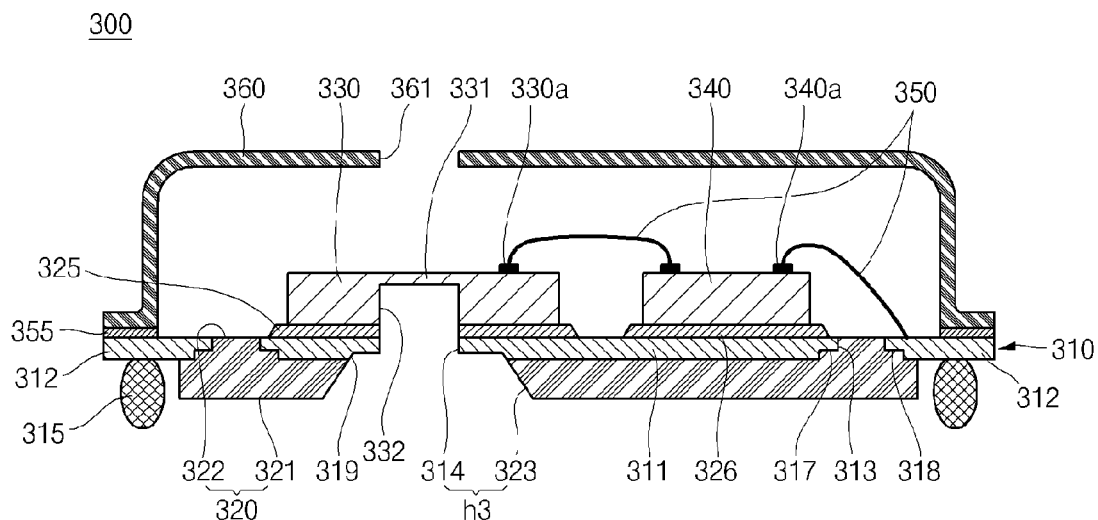
FIG. 3 is a cross-sectional view of a semiconductor device or package constructed in accordance with a third embodiment of the present invention.

Referring now to FIG. 3, there is shown a semiconductor package or device 300 constructed in accordance with a third embodiment of the present invention. The semiconductor device 300 comprises a leadframe 310 which includes a generally quadrangular (e.g., square) die paddle or die pad 311 which defines four peripheral edge segments. Additionally, when viewed from the perspective shown in FIG. 3, the die pad 311 defines opposed, generally planar top and bottom surfaces. As seen in FIG. 3, the die pad 311 includes an exposure hole or aperture 314 formed therein. The functionality of the aperture 314 in the completed semiconductor device 300 will be described in more detail below. As further seen in FIG. 3, the die pad 311 of the leadframe 310 is not of uniform thickness. Rather, a peripheral portion of the bottom surface of the die pad 311 is partially etched (e.g., half-etched) to define an etched surface 317. Further, a portion of the bottom surface of the die pad 311 circumventing the aperture 314 is partially etched or otherwise removed or ablated in a manner facilitating the formation of an angled or beveled wall 319.

In addition to the die pad 311, the leadframe 310 comprises a plurality of leads 312. In the semiconductor device 300, the leads 312 are preferably segregated into four sets, with each set of the leads 312 extending along and in spaced relation to a corresponding one of the peripheral edge segments defined by the die pad 311. The number of leads 312 included in each set thereof may be varied in accordance with the prescribed application for the semiconductor device 300. When viewed from the perspective shown in FIG. 3, the opposed, generally planar top and bottom surfaces of each lead 312 extend in generally co-planar relation to respective ones of the opposed top and bottom surfaces of the die pad 311. As seen in FIG. 3, the leads 312 are separated from the die pad 311 and each other by spaces or gaps 313. As further seen in FIG. 3, the leads 312 are not of uniform thickness. Rather, an inner end portion of the bottom surface of each lead 312 is partially etched (e.g., half-etched) to define an etched surface 318. The etched surface of each lead 312 extends to the inner end thereof disposed closest to the die pad 311.

The leadframe 310 may be fabricated from a conventional metal material, such as copper, copper alloy, steel plated with copper, or a functional equivalent. By way of example, the leadframe 310 may be a copper-based leadframe (copper/iron/phosphorous; 99.8/0.01/0.025), a copper alloy-based leadframe (copper/chromium/tin/zinc; 99.0/0.25/0.22), or an alloy 42-based leadframe (iron/nickel; 58.0/42.0). However, those of ordinary skill in the art will recognize that the present invention is not limited to any particular material for the leadframe 310. Additionally, though the leads 312 are described above as being segregated into four sets, it will be recognized that fewer sets thereof may be provided, and may be arranged along any combination of two or three of the peripheral sides of the die pad 311. It is further contemplated that the leadframe 310 may be fabricated through the implementation of a chemical etching process or alternatively a mechanical stamping process.

In the semiconductor device 300, formed on the bottom surface of each of the leads 312 is a conductive member 315. The conductive members 315 are used to facilitate the electrical and mechanical contact between the semiconductor device 300 and an external device. The conductive members 315 each preferably comprise a solder ball.

The semiconductor device 300 further comprises a MEMS die 330, the bottom surface of which is attached to the top surface of the die pad 311 through the use of an adhesive layer 325. The MEMS die 330 includes a hole or opening 332 formed therein, one end of which is covered by a diaphragm 331 of very small thickness. That end of the opening 332 covered by the diaphragm 330 is that end which is disposed furthest from the die pad 311, and in particular the top surface thereof. As seen in FIG. 3, the MEMS die 330 is attached to the die pad 311 at a location wherein the opening 332 thereof, and hence the diaphragm 331, is substantially aligned with the aperture 314 disposed within the die pad 311. The MEMS die 330 also includes one or more terminals or bond pads 330a formed on the top surface thereof.

The semiconductor device 300 further comprises a semiconductor die 340 which, like the MEMS die 330, has a bottom surface which is attached to the top surface of the die pad 311 by an adhesive layer 326. When attached to the top surface of the die pad 311 by respective ones of the adhesive layers 325, 326, the MEMS die 330 and the semiconductor die 340 are disposed in spaced relation to each other. As seen in FIG. 3, the top surface of the semiconductor die 340 includes one or more bond pads 340a disposed thereon.

In the semiconductor device 300, the MEMS die 330 is electrically connected to the semiconductor die 340 through the use of at least one conductive wire 350 which extends from one of the bond pads 330a of the MEMS die 330 to a corresponding one of the bond pads 340a of the semiconductor die 340. Additionally, one or more bond pads 330a of the MEMS die 330 and/or one or more of the bond pads 340a of the semiconductor die 340 are each preferably electrically connected to a corresponding one of the leads 312 through the use of a conductive wire 350. In FIG. 3, one exemplary conductive wire 350 is depicted as electrically connecting the MEMS die 330 and the semiconductor die 340 to each other, with one exemplary conductive wire 350 being shown as electrically connecting one of the bond pads 340a of the semiconductor die 340 to a respective one of the leads 312. In the semiconductor device 300, it is contemplated that any conductive wire(s) 350 extending between any bond pads 330a, 340a and any lead 312 will extend to the top surface of such lead 312.

In the semiconductor device 300, the die pad 311 and the leads 312 are at least partially encapsulated or covered by an encapsulant material which, upon hardening, forms a body 320 of the semiconductor device 300. As seen in FIG. 2, the body 320 is formed so as to flow through at least portions of the gaps 313 separating the leads 312 from each other and from the die pad 311. As such, the fully formed body 320 partially encapsulates the leads 312 and the die pad 311, and defines a generally planar top surface 322 which extends in generally co-planar relation to the top surface of the die pad 311 and the top surfaces of the leads 312. The fully formed body 320 further defines a generally planar bottom surface 321. However, the body 320 does not cover the conductive members 315, with the peripheral side surface of the body 320 being disposed inward relative to the conductive members 315 when viewed from the perspective shown in FIG. 3. As also shown in FIG. 3, the conductive members 315 are each sized so as to extend downwardly beyond the bottom surface of the body 320. The body 320 functions to prevent undesirable short circuits between the leadframe 310 and an external device to which the conductive members 315 may be mounted. Additionally, the partial encapsulation of the die pad 311 and leads 312 by virtue of the flow of the encapsulant material used to form the body 320 through at least portions of the gaps 313 improves the coupling force or mechanical interlock between the body 320 and the leadframe 310.

As further seen in FIG. 3, the body 320 of the semiconductor device 300 is further formed to include an exposure hole or aperture 323 formed therein. The aperture 323 is preferably defined by a circularly configured, beveled surface which extends angularly from the bottom surface 321 of the body 320, and is substantially flush or continuous with the beveled wall 319 defined by the die pad 311. Additionally, the aperture 323 is formed within the body 320 so as to be coaxially aligned with the aperture 314 formed within the die pad 311. As such, the apertures 314, 323, and the etched or removed surface of the die pad 311 (including the wall 319) circumventing the aperture 314 collectively define a port hole h3 which is coaxially aligned with the opening 332 of the MEMS die 330, and hence the diaphragm 331 thereof.

The semiconductor device 300 further comprises a cover or lid 360 which is attached to the leadframe 310 and to the body 320. More particularly, the lid 360 is attached to the exposed portions of the top surfaces of the leads 312, and to a peripheral portion of the top surface 322 of the body 320, including those portions of the top surface 322 which are disposed between adjacent pairs of the leads 312. The attachment of the lid 360 to the leads 312 and body 320 is preferably facilitated through the use of an adhesion member 355. In the semiconductor device 300, it is contemplated that the adhesion member 355 may be made of an insulating material or a conductive material. By way of example and not by way of limitation, the adhesion member 355 may be made of a conductive material such as solder, with an electrical path thus being formed between the lid 360, the adhesion member 355 and the leadframe 310. In this instance, any lead 312 of the leadframe 310 contacting the adhesion member 355 may be used as a ground region. When the lid 360 is attached to the leadframe 310 and the body 320 in the aforementioned manners, such lid 360 effectively covers the MEMS die 330, the semiconductor die 340, and the conductive wires 350. The lid 360 is further formed to include an acoustic hole 361 which, as seen in FIG. 3, is substantially aligned with the diaphragm 331 of the MEMS die 330. The use of the acoustic hole 361 will be discussed in more detail below. The lid 360 may be made of a metal material, though other materials for the lid 360 are contemplated to be within the spirit and scope of the present invention.

The port hole h3 collectively defined by the apertures 314, 323 effectively exposes the diaphragm 331 of the MEMS die 330 in the semiconductor device 300. In this regard, the port hole h3 allows the diaphragm 331 to sufficiently react with an externally applied acoustic signal. The gradually increasing width or diameter of the port hole h3 from the etched or removed surface of the die pad 311 circumventing the aperture 314 to the bottom surface 321 of the body 320 attributable to the beveled configurations of the wall 319 and the wall of the body 320 defining the aperture 323 improves the transmission of the externally applied acoustic signal to the diaphragm 331.

As indicated above, the acoustic hole 361 of the lid 360 allows for the passage of an acoustic signal therethrough. In the semiconductor device 300, the MEMS die 330 is configured to convert the acoustic signal supplied through the acoustic hole 361 of the lid 360 into an electrical signal according to a change in the capacitance. Stated another way, the MEMS die 330 is configured to detect capacitance varying according to oscillation of the diaphragm 331 (the oscillation generated by the acoustic wave induced through the acoustic hole 361 of the lid 360), and to then convert the detected capacitance into an electrical signal. The MEMS die 330 may be fabricated such that a back plate is formed on a wafer using a MEMS technique, with the diaphragm 331 thereafter being formed on the MEMS die 330.

The semiconductor die 340 included in the semiconductor device 300 and electrically connected to the MEMS die 330 may be formed as an application specific integrated circuit (ASIC) for processing an electrical signal. For example, the semiconductor die 340 may include a voltage pump that offers a voltage to allow the MEMS die 330 to operate as a condenser microphone, and a buffer IC for providing an acoustic signal detected by the MEMS die 330 to an external device through a connection terminal by amplifying or matching the detected acoustic signal.

Thus, based on the foregoing, the semiconductor device 300 may implement a microphone using the leadframe 310 rather than a conventional printed circuit board or PCB, thus allowing for such implementation at lower cost. Additionally, the configuration of the leadframe 310 and body 320, considered in conjunction with the manner in which the MEMS die 330 is secured to the leadframe 310 and aligned with the port hole h3, allows the diaphragm 331 of the MEMS die 330 to sufficiently react with an externally applied acoustic signal, thereby providing a highly reliable microphone.

Figure 8:
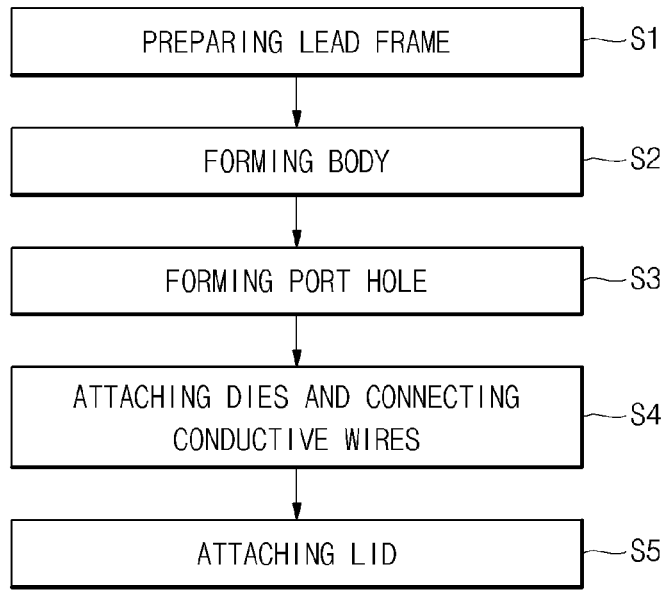
FIG. 8 is a flow chart describing an exemplary fabrication method for the semiconductor device of the third embodiment shown in FIG. 3.

Referring now to FIG. 8, there is provided a flow chart which sets forth an exemplary method for fabricating the semiconductor device 300 of the present invention. The method comprises the steps of preparing the leadframe 310 (S1), forming the body 320 (S2), forming the port hole h3 (S3), attaching the MEMS and semiconductor dies 330, 340 to the leadframe 310 and electrically connecting them to the leadframe 310 and each other through the use of the conductive wires 350 (S4), and attaching the lid 360 to the leadframe 310 and body 320 (S5). FIGS. 9A-9E provide illustrations corresponding to these particular steps, as will be discussed in more detail below.

Figure 9A:
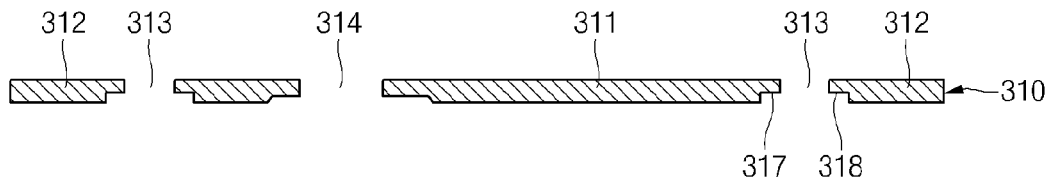
FIGS. 9A-9E are views illustrating an exemplary sequence of steps for the fabrication of the semiconductor device of the third embodiment shown in FIG. 3.

Referring now to FIG. 9A, in the initial step S1 of the fabrication process for the semiconductor device 300, the leadframe 310 having the above-described structural attributes is provided. The leadframe 310 includes the die pad 311 having the aperture 314 formed therein, and the leads 312. As indicated above, the leadframe 310 may be formed through the use of either an etching or a mechanical stamping technique. At the stage of the formation of the leadframe 210 as shown in FIG. 9A, the die pad 311 is provided with the etched surface 217, with each of the leads 312 being provided with the etched surface 318. Upon the formation of the etched surfaces 317, 318, the conductive members 315 are formed on the bottom surfaces of each of the leads 312.

Figure 9B:
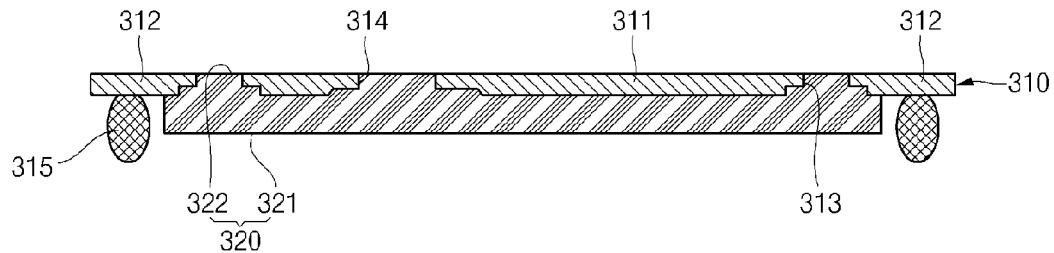

Referring now to FIG. 9B, in the next step S2 of the fabrication process for the semiconductor device 300, the body 320 is formed in the aforementioned manner. In this regard, as previously explained, the encapsulant material used to form the body 320 is applied to the die pad 311 and leads 312 of the leadframe 310 so as to flow through the gaps 313 separating the leads 312 from each other, and from the die pad 311. As further seen in FIG. 9B, the encapsulant material used to form the body 320 also flows through the aperture 314 within the die pad 311. As is also apparent from FIG. 7B, the encapsulant material is not applied to the conductive members 315. The body 320 may be formed by, for example, molding using a resin.

Figure 9C:
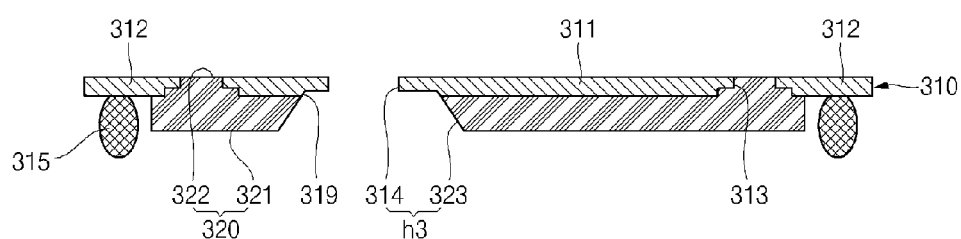

Referring now to FIG. 9C, in the next step S3 of the fabrication process for the semiconductor device 300, the port hole h3 is formed in the body 320 and die pad 311. The formation of the port hole h3 is accomplished by subjecting the body 320 to an ablation process which facilitates the formation of the above-described aperture 323 and the removal of the encapsulant material used to form the body 320 from within the aperture 214. The ablation process also results in the formation of the etched or removed surface of the die pad 311 which circumvents the aperture 314 and defines the beveled wall 319. The ablation process may be accomplished by, for example, the use of a laser.

Figure 9D:
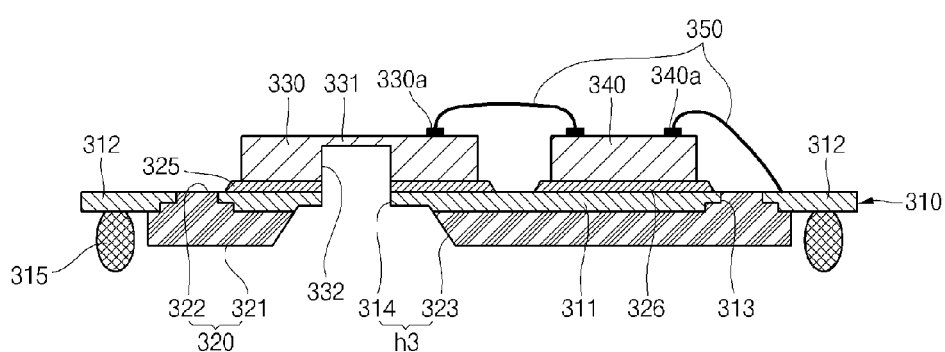

Referring now to FIG. 9D, in the next step S4 of the fabrication process for the semiconductor device 200, the MEMS die 330 and semiconductor die 340 are each attached to the top surface of the die pad 311 through the use of the adhesive layers 325, 326 in the above-described orientations. Thus, as previously explained, the opening 332 of the MEMS die 330, and hence the diaphragm 331 thereof, are each coaxially aligned with the port hole h3. Thereafter, as also seen in FIG. 9D, the conductive wires 350 are used to electrically connect the MEMS and semiconductor dies 330, 340 to each other and to one or more leads 312 of the leadframe 310 in any one of a multiplicity of potential arrangements.

Figure 9E:
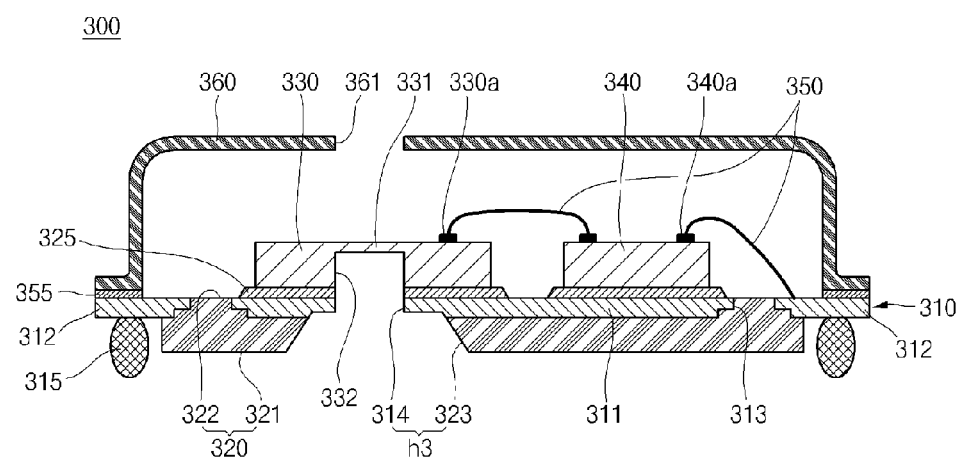

Referring now to FIG. 9E, in the next step S5 of the fabrication process for the semiconductor device 300, the lid 360 is attached to the leads 312 and to the body 320 through the use of the above-described adhesion member 355. When attached to the leads 312 of the leadframe 310 and to the body 320, the lid 360 effectively covers the MEMS and semiconductor dies 330, 340, as well as the conductive wires 350, with the acoustic hole 361 of the lid 360 being substantially aligned with the diaphragm 331 of the MEMS die 330.

Thus, in the semiconductor device 300 fabricated in accordance with the above-described manufacturing method, the port hole h3 can be formed in a simplified manner using laser ablation. Thus, the manufacturing method for the semiconductor device 300 can simplify the process of facilitating the exposure of the diaphragm 331 of the MEMS die 330.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor device, comprising:
a die pad including a die pad aperture, the die pad having opposed first and second die pad major surfaces;
a plurality of leads disposed in spaced relation to the die pad;
a semiconductor die attached to the first die pad major surface and electrically connected to at least one of the leads;
a MEMS die attached to the first die pad major surface and electrically connected to at least the semiconductor die, the MEMS die including a diaphragm;
a body at least partially encapsulating the die pad and the leads such that at least portions of the leads are exposed therein, the body including a body aperture, the die pad and body apertures collectively defining a port hole exposing the diaphragm, the body partially undercut to expose portions of the second die pad major surface adjacent opposed sides of the body aperture; and
a lid attached to the body and at least one of the leads in a manner covering the semiconductor die and the MEMS die.

2. The semiconductor device of claim 1, wherein the exposed portions of the second die pad major surface are partially recessed and have a beveled surface, and wherein the body aperture has a circularly configured beveled surface substantially flush with the beveled surface of the second die pad major surface.

3. The semiconductor device of claim 1, wherein the lid includes an acoustic hole generally aligned with the diaphragm of the MEMS die.

4. The semiconductor device of claim 1 wherein the lid is attached to the body and at least one of the leads with an adhesion member.

5. The semiconductor device of claim 4, wherein the adhesion member comprises one or more of an insulating material and a conductive material.

6. The semiconductor device of claim 1, wherein:
the body defines a generally planar bottom surface having the body aperture;
the die pad aperture and the body aperture are aligned with each other; and
the body aperture is of gradually increasing width as it extends from die pad aperture to the bottom surface of the body.

7. The semiconductor device of claim 1, wherein:
the semiconductor die is electrically connected to at least one of the leads by a first conductive wire;
the MEMS die is electrically connected to the semiconductor die by a second conductive wire; and
the first and second conductive wires are covered by the lid.

8. The semiconductor device of claim 1, wherein each of the plurality of leads defines an inner portion which is partially embedded in the body, and an outer portion which protrudes from the body.

9. The semiconductor device of claim 8, wherein the outer portion of each of the plurality of leads comprises a gull-wing configuration.

10. The semiconductor device of claim 8 further comprising a plurality of conductive members, wherein the only conductive members present are the plurality of conductive members formed on bottom surfaces of the plurality of leads.

11. The semiconductor device of claim 8 further comprising a plurality of conductive members, wherein the only conductive members present are the plurality of conductive members formed on bottom surfaces of the plurality of leads, wherein each conductive member which is partially encapsulated by the body such that a portion of each conductive member is exposed in a common exterior surface defined by the body.

12. A semiconductor device, comprising:
a leadframe having first and second leadframe major surfaces;
a semiconductor die attached and electrically connected to the leadframe;
a MEMS die attached to the leadframe and electrically connected to at least the semiconductor die, the MEMS die including a diaphragm;
a body at least partially encapsulating the leadframe such that at least portions of the first leadframe major surface are exposed therein, the body and the leadframe collectively defining a port hole which exposes a first surface of the diaphragm; and
a lid attached to at least one of the leadframe and the body in a manner covering the semiconductor die and the MEMS die, the lid having an acoustic hole generally aligned with a second surface of the diaphragm.

13. The semiconductor device of claim 12, wherein a portion of the body is undercut to expose portions of the second leadframe major surface adjacent the port hole.

14. The semiconductor device of claim 13, wherein the exposed portions of the second leadframe major second surface are partially recessed and have beveled surfaces.

15. The semiconductor device of claim 12, wherein the lid is attached to at least the leadframe through the use of an adhesion member, and wherein the adhesion member comprises one or more of an insulating material and a conductive material.

16. The semiconductor device of claim 12, wherein the body defines an exterior surface, and at least a portion of the port hole is of gradually increasing width as it extends from the MEMS die to the exterior surface of the body.

17. The semiconductor device of claim 12, wherein:
the semiconductor die is electrically connected to the leadframe by a first conductive wire;
the MEMS die is electrically connected to the semiconductor die by a second conductive wire; and
the first and second conductive wires are covered by the lid.

18. The semiconductor device of claim 12, wherein the leadframe includes portions protruding from the body.

19. The semiconductor device of claim 12 further comprising a plurality of conductive members, wherein the only conductive members present consist of the plurality of conductive members formed on the second major surface of the leadframe.

20. A semiconductor device, comprising:
a die pad having opposed first and second die pad major surfaces;
a plurality of leads which are disposed in spaced relation to the die pad;
a semiconductor die attached to the first die pad major surface and electrically connected to at least one of the leads;
a MEMS die attached to the die pad and electrically connected to at least the semiconductor die, the MEMS die including a diaphragm;
a body at least partially encapsulating the die pad and the leads such that at least portions of the leads are exposed therein, the body and the die pad collectively defining a port hole exposing a first surface of the diaphragm, the body undercut to expose portions of the second die pad major surface adjacent opposed sides of the port hole; and
a lid attached to the body and at least one of the leads in a manner covering the semiconductor die and the MEMS die, the lid including an opening generally aligned with a second surface of the diaphragm.

* * * * *